United States Patent
Onishi

(10) Patent No.: US 9,014,398 B2
(45) Date of Patent: Apr. 21, 2015

(54) CHARGING CIRCUIT AND AMPLIFIER

(75) Inventor: Akinobu Onishi, Ota (JP)

(73) Assignee: Semiconductor Components Industries, LLC, Phoenix, AZ (US)

( * ) Notice: Subject to any disclaimer, the term of this patent is extended or adjusted under 35 U.S.C. 154(b) by 759 days.

(21) Appl. No.: 12/972,303

(22) Filed: Dec. 17, 2010

(65) Prior Publication Data

US 2011/0150243 A1  Jun. 23, 2011

(30) Foreign Application Priority Data

Dec. 18, 2009  (JP) ................................. 2009-287598

(51) Int. Cl.
| H04R 3/00 | (2006.01) |
| H02M 3/07 | (2006.01) |
| H03F 3/187 | (2006.01) |
| H03F 3/45 | (2006.01) |

(52) U.S. Cl.
CPC ................. *H02M 3/07* (2013.01); *H03F 3/187* (2013.01); *H03F 3/45475* (2013.01); *H03F 2200/03* (2013.01); *H03F 2203/45526* (2013.01); *H03F 2203/45568* (2013.01); *H03F 2203/45571* (2013.01)

(58) Field of Classification Search
CPC ....................................................... H04R 3/00
USPC .................... 381/111, 113, 122; 330/127, 135
See application file for complete search history.

(56) References Cited

U.S. PATENT DOCUMENTS

| 8,041,056 B2* | 10/2011 | Kinoshita ...................... 381/113 |
| 8,699,726 B2* | 4/2014 | Steele et al. .................. 381/113 |
| 2007/0160234 A1* | 7/2007 | Deruginsky et al. .......... 381/113 |
| 2008/0075306 A1* | 3/2008 | Poulsen et al. ................ 381/111 |
| 2010/0166228 A1* | 7/2010 | Steele et al. .................. 381/113 |
| 2011/0038491 A1* | 2/2011 | Barr et al. ..................... 381/107 |

FOREIGN PATENT DOCUMENTS

| JP | 2006-50833 | 2/2006 |
| KR | 20020073381 A | 9/2002 |

OTHER PUBLICATIONS

Patent Abstracts of Japan for patent application with Publication No. 2006-050833, Publication Date: Feb. 16, 2006, 1 page.
Mechanical English translation for Japanese patent application with Publication No. 2006-050833, Publication date: Feb. 16, 2006, 8 pages.
Office Action for Korean Application No. 10-2010-130019 mailed Oct. 26, 2011, with English translation thereof (6 pages).
Patent Abstract for Korean Publication No. 20020073381 Published Sep. 26, 2002 (1 page).

* cited by examiner

Primary Examiner — Disler Paul

(57) ABSTRACT

A charging circuit includes a charge pump circuit, an integrating circuit, and a clock signal output circuit. The charge pump circuit generates a boosted voltage by boosting an input voltage at a rate in synchronization with an input clock signal. The integrating circuit is configured to integrate the boosted voltage to apply the integrated boosted voltage to a boost capacitor. The clock signal output circuit is configured to output a second clock signal that is higher in frequency than a first clock signal to the charge pump circuit as the clock signal for a predetermined period of time upon start up, and thereafter output the first clock signal to the charge pump circuit as the clock signal.

20 Claims, 3 Drawing Sheets

CHARGING CIRCUIT AND AMPLIFIER

CROSS-REFERENCE TO RELATED APPLICATION

This application claims the benefit of priority to Japanese Patent Application No. 2009-287598, filed Dec. 18, 2009, of which full contents are incorporated herein by reference.

BACKGROUND OF THE INVENTION

1. Field of the Invention

The present invention relates to a charging circuit and an amplifier.

2. Description of the Related Art

A charge pump circuit is known as a circuit that applies a boosted voltage generated by boosting an input voltage to a load, such as a capacitor (see, e.g., Japanese Laid-Open Patent Publication No. 2006-50833). Because the charge pump circuit usually generates the boosted voltage in synchronization with an input clock signal, noises are included in the boosted voltage. To eliminate such noises, for example, an LPF (Low-pass Filter) may be placed between the charge pump circuit and the capacitor as a load.

Capacitive loads driven by the charge pump circuit include, for example, a capacitor for a microphone that detects an audio signal. When the charge pump circuit is used as a power supply circuit, a load, such as an LED, may be connected to the capacitor as a load. For this reason, it is important for the charge pump circuit to boost the charge voltage of the capacitor as the load in a shorter time. When the LPF is provided to eliminate noises included in the boosted voltage, as described above, however, a time needed for boosting the charge voltage of the capacitor gets longer than a time need in a case of not providing the LPF. To deal with this problem, for example, the frequency of a clock signal for operating the charge pump circuit may be increased to shorten the time needed for boosting the charge voltage of the capacitor. This case, however, brings a problem that an increase in the frequency of the clock signal leads to an increase in power consumption by the charge pump circuit.

SUMMARY OF THE INVENTION

An charging circuit according to an aspect of the present invention, comprises: a charge pump circuit configured to generate a boosted voltage obtained by boosting an input voltage at each time interval shorter in accordance with an increase of a frequency of an input clock signal;

an integrating circuit configured to integrate the boosted voltage to apply the integrated boosted voltage to a capacitor; and a clock signal output circuit configured to output a second clock signal higher in frequency than a first clock signal to the charge pump circuit as the clock signal, and thereafter output the first clock signal to the charge pump circuit as the clock signal, in order that a charge voltage of the capacitor reaches a predetermined voltage level in a time shorter than a time in which the charge voltage of the capacitor reaches the predetermined voltage level when the first clock signal is input to the charge pump circuit as the clock signal.

Other features of the present invention will become apparent from descriptions of this specification and of the accompanying drawings.

BRIEF DESCRIPTION OF THE DRAWINGS

For more thorough understanding of the present invention and advantages thereof, the following description should be read in conjunction with the accompanying drawings, in which.

DETAILED DESCRIPTION OF THE INVENTION

At least the following details will become apparent from descriptions of this specification and of the accompanying drawings.

Figure 1:
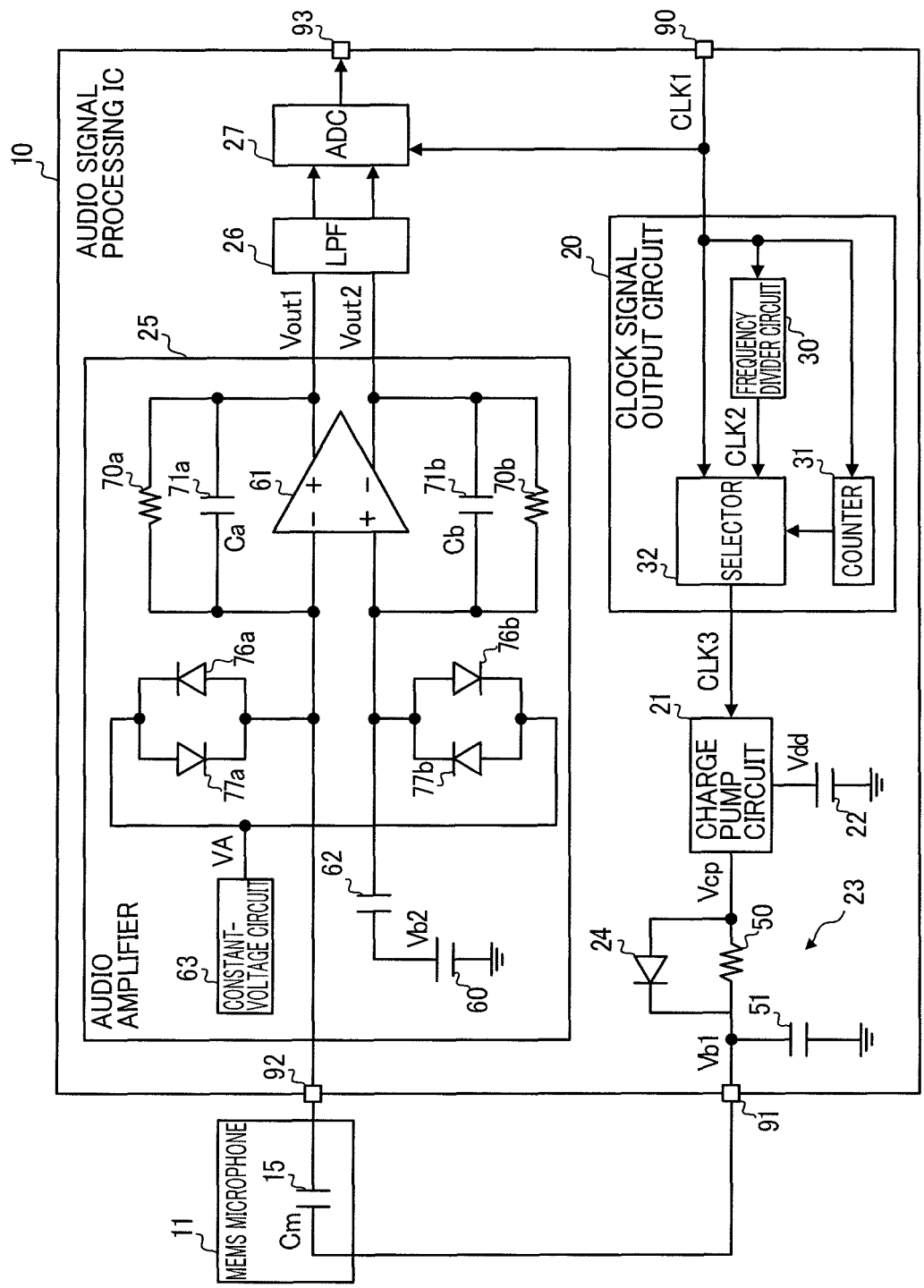
FIG. 1 depicts a configuration of an audio signal processing IC (Integrated Circuit) 10 of one embodiment of the present invention.

FIG. 1 depicts a configuration of an audio signal processing IC (Integrated Circuit) 10 of one embodiment of the present invention. The audio signal processing IC 10 is, for example, a circuit that amplifies and digitizes an audio signal detected by an MEMS (Micro Electromechanical System) microphone 11. The audio signal processing IC 10 includes a clock signal output circuit 20, a charge pump circuit 21, a power supply circuit 22, LPFs 23 and 26, a diode 24, an audio amplifier 25, an ADC (Analog-to-Digital Converter) 27, and terminals 90 to 93. The clock signal output circuit 20, the charge pump circuit 21, and the LPF 23 correspond to a charging circuit.

The MEMS microphone 11 connected between the terminal 91 and the terminal 92 is a capacitor microphone that generates a signal in accordance with an audio, and includes a capacitor 15 whose capacitance varies changes according to the audio. The capacitor 15 has one end connected to the terminal 91 and the other end connected to the terminal 92. The MEMS microphone 11 behaves desirably when a bias voltage V1 of a predetermined voltage level is applied to the one end of the capacitor 15. In this embodiment, the capacitance value of the capacitor 15 is given as Cm.

The clock signal output circuit 20 is a circuit that outputs a clock signal CLK3 in accordance with a clock signal CLK1 input to the terminal 90. The clock signal output circuit 20 includes a frequency divider circuit 30, a counter 31, and a selector 32.

The frequency divider circuit 30 is a circuit that generates a clock signal CLK2 (first clock signal) by dividing the clock signal CLK1 (second clock signal) in frequency. The frequency divider circuit 30 divides the clock signal CLK1 in frequency by 32. The counter 31 increments a counter value in 1 in synchronization with each rising edge of the clock signal CLK1 until, for example, a counter value reaches the maximum.

When a counter value of the counter 31 is smaller than the maximum, the selector 32 (output circuit) outputs the clock signal CLK1 as the clock signal CLK3 to the charge pump circuit 21. When a counter value of the counter 31 reaches the maximum, the selector 32 outputs the clock signal CLK2 as the clock signal CLK3 to the charge pump circuit 21.

Figure 2:
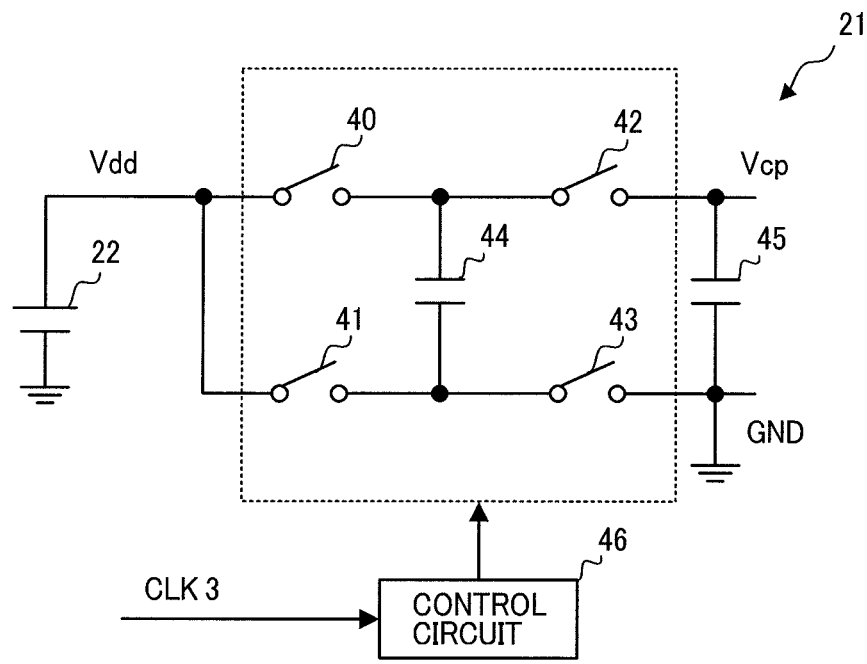
FIG. 2 depicts a configuration of a charge pump circuit 21.

The charge pump circuit 21 is a circuit that generates the bias voltage V1 needed to drive the MEMS microphone 11. Specifically, the charge pump circuit 21 generates a boosted voltage Vcp by boosting an input power supply voltage Vdd from the power supply 22 in synchronization with the incoming clock signal CLK3. As depicted in FIG. 2, the charge pump circuit 21 includes switches 40 to 43, capacitors 44 and 45, and a control circuit 46.

The switch 40 is connected between the power supply 22 and one end of the capacitor 44, while the switch 41 is connected between the power supply 22 and the other end of the capacitor 44. The switch 42 is connected between the one end of the capacitor 44 and one end of the capacitor 45, while the switch 43 is connected between the other end of the capacitor 44 and the other end of the capacitor 45. The capacitor 44 and the capacitor 45 have the same capacitance value, which is, for example, a capacitance value C1.

When the clock signal CLK3 is, for example, high level, the control circuit 46 turns on the switches 40 and 43 and turns off the switches 41 and 42. In contrast, when the clock signal CLK3 is, for example, low level, the control circuit 46 turns on the switches 41 and 42 and turns off the switches 40 and 43. When the clock signal CLK3 becomes high level, therefore, the capacitor 44 is charged to have a charge voltage equal to the source voltage Vdd. Subsequently, when the clock signal CLK3 becomes low level, the source voltage Vdd is applied to the other end of the charged capacitor 44. This boosts a voltage Vcp at the one end of the capacitor 45 to a voltage two times the source voltage Vdd (2×Vdd). Electric charges Q with which the capacitor 45 is charged is expressed as Q=2×C1×Vdd.

The LPF 23 (integrating circuit) is a filter that allows only the low-frequency component of the voltage Vcp to pass through the filter. The LPF 23 includes a resistor 50 and a capacitor 51. The resistor 50 and the capacitor 51 are connected to a node, which is connected to the terminal 91, to which, as described above, the capacitor 15 is connected. Hence, in this embodiment, the charge voltage of the capacitor 15 and that of the capacitor 51 is the same charge voltage Vb1.

The diode 24 is provided between the charge pump circuit 21 and the capacitor 51, and turns on when supplied with a forward voltage of, for example, 0.7 V or higher. For this reason, for example, when the voltage Vcp is 0.7 V or more higher than the charge voltage Vb1, the diode 24 turns on. When the voltage Vcp is not 0.7 V or more higher than the charge voltage Vb1, on the other hand, the diode 24 turns off. This means that when the voltage Vcp becomes 0.7 V or more higher than the charge voltage Vb1, the diode 24 rectifies the voltage Vcp, thus charging the capacitor 51. As the diode 24 remains on, therefore, the capacitor 51 is charged via the diode 24, which raises the charge voltage Vb1. Even when the charge voltage Vb1 rises to cause the diode 24 to turn off, for example, the capacitor 51 is kept charged via the resistor 50. Hence the charge voltage Vb1 becomes to a voltage equivalent to 2×Vdd in the end.

The audio amplifier 25 is a circuit that amplifies an audio detected by the capacitor 15 to output the amplified audio. The audio amplifier 25 includes a bias voltage circuit 60, an operational amplifier 61, a constant-voltage circuit 63, capacitors 62, 71a, and 71b, resistors 70a and 70b, and diodes 76a, 76b, 77a, and 77b. The clock signal output circuit 20, the charge pump circuit 21, the LPF 23, the operational amplifier 61, the resistor 70a, the capacitor 71a, and the diodes 76a, and 77a are correspond to an amplifier, and the diodes 76a and 77a are correspond to a clamp circuit.

The bias voltage circuit 60 generates a voltage Vb2 of a predetermined voltage level to apply the voltage Vb2 to the capacitor 62.

The operational amplifier 61 is a fully differential operational amplifier, having a inverting input terminal to which the capacitor 15 is connected via the terminal 92. The resistor 70a and the capacitor 71a are connected between the inverting input terminal and a non-inverting output terminal of the operational amplifier 61. The resistor 70a is a feedback resistor for adjusting a dc voltage level at the inverting input terminal and at the non-inverting output terminal of the operational amplifier 61 to, for example, a voltage VA. In this embodiment, the resistor 70a is designed to have impedance that is sufficiently larger than the impedance of the capacitance 71a. Because of this, the voltage Vb1 applied to the capacitor 15 is inverted and amplified at a gain that is determined by the ratio between the capacitor 15 (first capacitor) and the capacitor 71a (second capacitor). In this manner, the operational amplifier 61 and the capacitors 15 and 71a make up an inverting amplifier. Since the capacitance of the capacitor 15 varies depending on audio signals, the inverting amplifier made up of the operational amplifier 61 and the capacitors 15 and 71a amplifies audio signals and noise components input to the operational amplifier 61.

For example, when the capacitance of the capacitor 71a is Ca and a voltage at the non-inverting output terminal of the operational amplifier 61 is Vout1, the voltage Vout1 is expressed as Vout1=−(Cm/Ca)×Vb1. If the capacitance of the capacitor 15 changes, for example, by ΔCm, therefore, ΔVout1 representing a change in the output voltage Vout1 is expressed as ΔVout1=−(ΔCm/Ca)×Vb1, where noise components entering the operational amplifier 61 are neglected.

The capacitor 62 is connected to a non-inverting input terminal of the operational amplifier 61, and the resistor 70b and the capacitor 71b are connected between the non-inverting input terminal and a inverting output terminal of the operational amplifier 61. The resistor 70b is the same as the resistor 70a, and the capacitor 71b is the same as the capacitor 71a. As a result, the operational amplifier 61 and the capacitors 62 and 71b also make up an inverting amplifier. In this embodiment, the voltage Vb2 has a predetermined voltage level, and the capacitors 62 and 71b each have a predetermined capacitance. Hence the inverting amplifier made up of the operational amplifier 61 and the capacitors 62 and 71b amplifies only the noise components input to the operational amplifier 61. As a result, for example, common mode noise included in the noise components are suppressed on a voltage Vout1-Vout2 representing a difference between the voltage Vout1 and a voltage Vout2 at the reverse output terminal of the operational amplifier 61.

The constant-voltage circuit 63 is a push-pull voltage generating circuit capable of generating the voltage VA and generating a sink current and a source current as well.

The diodes 76a and 77a are elements that clamp a voltage level at the inverting input terminal to keep the voltage level within a predetermined voltage range. A cathode of the diode 76a is connected to the constant-voltage circuit 63 and an anode of the diode 76a is connected to the inverting input terminal of the operational amplifier 61. An anode of the diode 77a is connected to the constant-voltage circuit 63 and a cathode of the diode 77a is connected to the inverting input terminal of the operational amplifier 61. The forward voltage of each of the diode 76a and the diode 77a is, for example, 0.7 V. For example, when a voltage at the inverting input terminal becomes higher than VA+0.7 V, the diode 76a (first diode) turns on. As a result, for example, electric charges between the capacitor 15 and the capacitor 71a are discharged via the diode 76a. In contrast, for example, when the voltage at the inverting input terminal becomes lower than VA−0.7 V, the diode 77a (second diode) turns on. As a result, for example, the capacitor 71a is charged via the diode 76a. In this manner, the voltage level at the inverting input terminal is clamped to stay within the voltage range of VA+0.7 V to VA−0.7 V.

The diodes 76b and 77b are elements that clamp a voltage level at the non-inverting input terminal to keep the voltage level within a predetermined voltage range. The diodes 76b and 77b behave in the same manner as the diodes 76a and 77a do, so that detailed description of the diodes 76b and 77b is omitted.

The LPF 26 is a filter that eliminates high-frequency components from an output signal from the audio amplifier 25 to prevent the generation of folding noises at the ADC 27.

The ADC 27 digitizes an output signal from the LPF 26 in synchronization with the clock signal CLK1 to output the digitized signal to the terminal 93. Digital data outputted from the terminal 93 is processed by, for example, a microcomputer (not depicted), etc.

=Operation of Audio Signal Processing IC 10=

Figure 3:
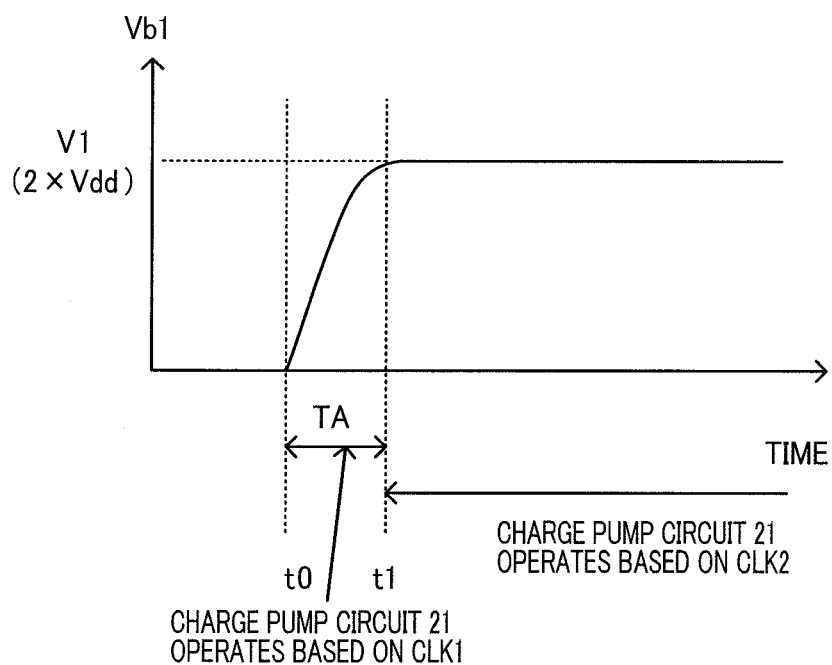
FIG. 3 is an explanatory diagram of the operation of the audio signal processing IC 10.

The operation of the audio signal processing IC 10 will be described with reference to FIG. 3. In this description, the bias voltage V1 for causing the MEMS microphone 11 to behave desirably is assumed to be, for example, 2×Vdd. It is also assumed that a period TA represents a period in which the charge pump circuit 21 causes the charge voltage Vb1 to change from 0 to 2×Vdd when supplied with the clock signal CLK1, and that the counter 31 is designed so that a time to take from the start of counting in synchronization with a rising edge of the clock signal CLK1 to a count value's reaching the maximum is equal to the period TA. It is further assumed that before the start up of the audio signal processing IC 10, the capacitor 51 is discharged and the counter 31 is reset.

When the audio signal processing IC 10 is started and the clock signal CLK1 is input at time t0, the counter 31 starts counting from 0, increments a counter value. Until a counter value reaches the maximum, the selector 32 outputs the clock signal CLK1 as the clock signal CLK3. The charge pump circuit 21 thus operates based on the clock signal CLK1. Specifically, the charge pump circuit 21 generates the boosted voltage Vcp at timing at which the clock signal CLK1 becomes low level, so that the capacitor 51 and the capacitor 15 are charged. As a result, the charge voltage Vb1 rises gradually. When time t1 arrives after an elapse of the period TA from the time t0, the charge voltage Vb1 of the capacitor 51 reaches the voltage V1=(2×Vdd), at which a counter value of the counter 31 becomes the maximum. Following the time t1, therefore, the selector 32 outputs the clock signal CLK2 as the clock signal CLK3. The charge pump circuit 21 thus operates based on the clock signal CLK2.

=Another Embodiment of Audio Amplifier=

Figure 4:
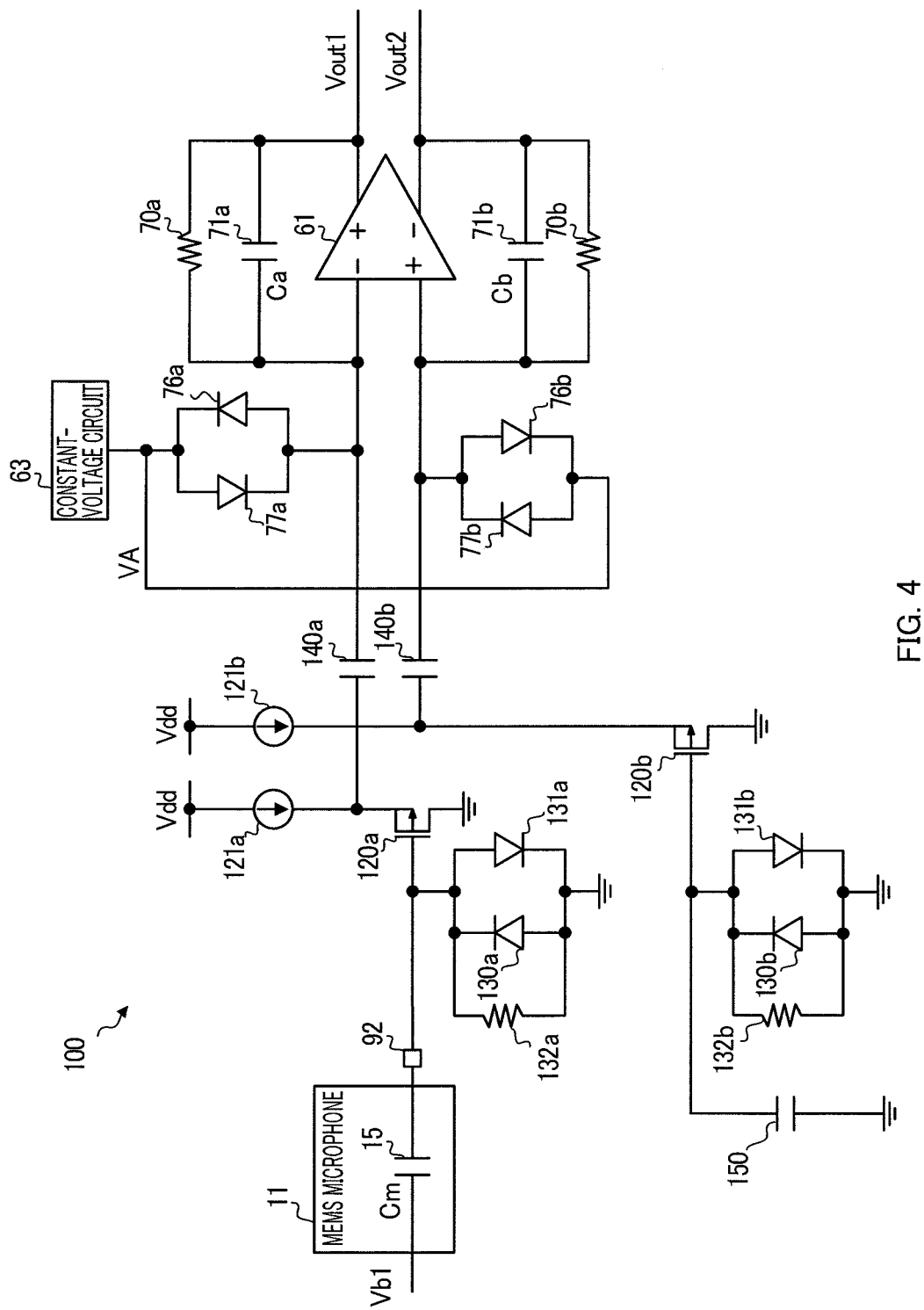
FIG. 4 depicts a configuration of an audio amplifier 100.

An audio amplifier 100 will then be described with reference to FIG. 4, which audio amplifier 100 is another embodiment of the audio amplifier that amplifies an audio detected by the capacitor 15 to output the amplified audio. The audio amplifier 100 is, for example, used in place of the audio amplifier 25 in the audio signal processing IC 10. The audio amplifier 100 is a circuit that amplifies an audio detected by the capacitor 15 to output the amplified audio. The audio amplifier 100 includes the operational amplifier 61, the constant-voltage circuit 63, the capacitors 71a, 71b, 140a, 140b and 150, the resistors 70a, 70b, 132a and 132b, the diodes 76a, 76b, 77a, 77b, 130a, 130b, 131a, and 131b, PMOS transistors 120a and 120b, and current sources 121a and 121b.

In the audio amplifier 100, the constituent blocks denoted by the same reference numerals in the audio amplifier 25 of FIG. 1 represent the same constituent blocks therein.

The source of the PMOS transistor 120a is supplied with a predetermined current from the current source 121a. As a result, the PMOS transistor 120a and the current source 121a operate as a source follower. The gate of the PMOS transistor 120a is connected to the capacitor 15 via the terminal 92. As a result, the gate voltage of the PMOS transistor 120a changes when the capacitance of the capacitor 15 changes in accordance with an incoming audio. Since the PMOS transistor 120a and the current source 121a operate as the source follower, as described above, a change in the gate voltage of the PMOS transistor 120a leads to a change in the source voltage of the PMOS transistor 120a. The source of the PMOS transistor 120a is connected to the inverting input terminal of the operational amplifier 61 via the capacitor 140a. The operational amplifier 61 and the capacitor 71a hence amplify a change in the source voltage of the PMOS transistor 120a. In this manner, the audio amplifier 100 amplifies an audio to output the amplified audio as the voltage Vout1.

The diodes 130a and 131a and the resistor 132a are connected between the gate of PMOS transistor 120a and the ground GND. The resistor 132a is a resistor that determines the dc voltage level of the gate voltage of the PMOS transistor 120a to be 0. The resistor 132a is, therefore, designed to have sufficiently large impedance so that a change in a voltage at the terminal 92 is amplified by the source follower at a voltage gain of approximately 1. The diodes 130a and 131a work in the same manner as the diodes 76a and 77a do. As a result, the gate voltage of the PMOS transistor 120a is clamped to stay within the range of 0 V±0.7 V.

The PMOS transistor 120b and the current source 121b make up a source follower in the same manner as the PMOS transistor 120a and the current source 121a do. The gate of the PMOS transistor 120b is connected to the diodes 130b and 131b, the resistor 132b, and the capacitor 150. The diodes 130b and 131b and the resistor 132b behave in the same manner as the diodes 130a and 131a and the resistor 132a do. The source of the PMOS transistor 120b is connected to the non-inverting input terminal of the operational amplifier 61 via the capacitor 140b.

The capacitor 150 is a capacitor having a predetermined capacitance. Consequently, only the noise components input to the gate of the PMOS transistor 120b are amplified by the operational amplifier 61 and the capacitor 71b, and are output as the voltage Vout2.

In this manner, similar to the audio amplifier 25, the audio amplifier 100 suppresses common mode noises and generates the voltage Vout1-Vout2 that changes in accordance with an audio. Even if the audio signal processing IC 10 is provided with the audio amplifier 100 in place of the audio amplifier 25, therefore, the audio signal processing IC 10 offers the same effect as in the case of using the audio amplifier 25.

According to the described audio signal processing IC 10 of this embodiment, the charge pump circuit 21 generates the boosted voltage Vcp every time the input clock signal CLK3 becomes low level. This means that charge pump circuit 21 boosts the voltage Vdd to generate the voltage Vcp at each time interval that gets shorter with an increase in the frequency of the clock signal CLK3. The clock signal output circuit 20 outputs the clock signal CLK1 as the clock signal CLK3 from the time t0 to the time t1, and then outputs the clock signal CLK2 as the clock signal CLK3 after the time t1. For example, if the clock signal CLK2 is output as the clock signal CLK3 from the time t0, the time the charge voltage Vd1 takes to reach the predetermined voltage level V1 becomes longer than the time the charge voltage Vd1 takes in this embodiment because the frequency of the clock signal CLK2 is lower than that of the clock signal CLK1. Hence, in this embodiment, the capacitor 15 can be charged more quickly. After the time t1, the charge pump circuit 21 of this embodiment operates based on the clock signal CLK2 lower in frequency than the clock signal CLK1. This reduces power consumption to be lower than power consumption in the case of, for example, keeping operating the charge pump circuit 21 base on the clock signal CLK1 after the time t1. The LPF 23 that integrates the voltage Vcp is provided between the charge pump circuit 21 and the capacitor 51. Noises to the capacitor 51 are thus suppressed through the LPF 23.

When a count value of the counter 31 is smaller than the maximum, the selector 32 outputs the clock signal CLK1 as the clock signal CLK3. When a counter value of the counter 31 becomes the maximum, the selector 32 outputs the clock signal CLK2 resulting from dividing the clock signal CLK1 in frequency, as the clock signal CLK3. In this manner, according to this embodiment, selection between the clock signal CLK1 and the clock signal CLK2 is controlled based on a counter value of the counter 32. Hence, the selector 32 can select the clock signal for the charge pump circuit 21 in accurate timing.

Until a level of the bias voltage to the MEMS microphone 11 becomes desired level, in general, noises generated from the charge pump circuit 21 do not pose a serious problem. In this embodiment, the diode 24 that rectifies the voltage Vcp is provided between the charge pump circuit 21 and the capacitor 15. With the diode 24, therefore, when the bias voltage to the capacitor 15, i.e., the charge voltage Vb1 is low, the capacitors 15 and 51 can be charged without using the resistor 50. Hence the charge voltage Vb1 is boosted more quickly than in the case of the absence of the diode 24.

The quick boost of the charge voltage Vb1, for example, may result in a significant change in a voltage at the inverting input terminal of the operational amplifier 61 connected via the capacitor 15. An audio signal cannot be amplified properly when the voltage at the inverting input terminal is in a state of significant change. In this embodiment, however, the voltage at the inverting input terminal is clamped to stay within the range of VA±0.7 V. This prevents the voltage at the inverting input terminal from changing significantly, thus enables proper amplification of an audio signal.

For example, when the voltage at the inverting input terminal rises to exceed the voltage of VA+0.7 V, the diode 76a turns on, and discharges the capacitor 71a. In contrast, for example, when the voltage at the inverting input terminal drops to below the voltage of VA-0.7 V, the diode 77a turns on, and charges the capacitor 71a. Hence the voltage level at the inverting input terminal is clamped accurately to stay between VA+0.7 V and VA-0.7 V.

While switchover between the clock signal CLK1 and the clock signal CLK2 is carried out based on, for example, a count value of the counter 31, the switchover may be carried out in another way. For example, a comparator that determines whether the voltage Vb1 becomes the predetermined level may be provided in place of the counter 31 to switch the clock signals CLK1 and CLK2 for each other based on an output result from the comparator.

In general, the optimum frequency of the clock signal CLK2 is determined depending on the capacitance of the capacitor 15. While the frequency divider circuit 30 of this embodiment divides the clock signal CLK1 in frequency by, for example, 32 (fixed frequency division ratio), therefore, a frequency divider circuit capable of changing a frequency division ratio may also be used. For example, using a frequency divider circuit whose frequency division ratio can be controlled by a microcomputer, etc., enables proper setting of the clock signal CLK2 depending on the capacitance of the capacitor 15.

The above embodiments of the present invention are simply for facilitating the understanding of the present invention and are not in any way to be construed as limiting the present invention. The present invention may variously be changed or altered without departing from its spirit and encompass equivalents thereof.

What is claimed is:

1. A charging circuit comprising:
   a charge pump circuit which generates a boosted voltage by boosting an input voltage at a rate in synchronization with an input clock signal;
   an integrating circuit configured to integrate the boosted voltage to apply the integrated boosted voltage to a boost capacitor; and
   a clock signal output circuit configured to output a second clock signal that is higher in frequency than a first clock signal to the charge pump circuit as the clock signal for a predetermined period of time upon start up, and thereafter output the first clock signal to the charge pump circuit as the clock signal, in order that a charge voltage of the boost capacitor reaches a predetermined voltage level in a time shorter than a time in which the charge voltage of the boost capacitor reaches the predetermined voltage level when the first clock signal is input to the charge pump circuit as the clock signal.

2. The charging circuit of claim 1, wherein the clock signal output circuit includes:
   a frequency divider circuit configured to divide the second clock signal in frequency to generate the first clock signal;
   a counter configured to change a count value based on the first clock signal or the second clock signal; and
   an output circuit configured to output the second clock signal as the clock signal to the charge pump circuit when a count value of the counter is smaller than a predetermined value, and output the first clock signal as the clock signal to the charge pump circuit when a count value of the counter reaches the predetermined value.

3. The charging circuit of claim 2, further comprising a diode configured to rectify the boosted voltage to charge the boost capacitor.

4. The charging circuit of claim 2, wherein the frequency divider circuit divides the second clock signal by 32.

5. The charging circuit of claim 1, further comprising a diode configured to rectify the boosted voltage to charge the boost capacitor.

6. The charging circuit of claim 1, wherein the charge pump circuit comprises:
   a first capacitor; and
   a first switch connected between the input voltage and a first end of the capacitor, a second switch connected between the input voltage and a second end of the first capacitor, a third switch connected between the first end of the capacitor and a first end of a second capacitor, and a fourth switch connected between the second end of the first capacitor and a second send of the second capacitor;
   wherein the first and fourth switches are switched on when the second and third switches are switched off, and the first and fourth switches are switched off when the second and third switches are switched on.

7. The charging circuit of claim 1, wherein the boosted voltage is double the input voltage when the first clock signal is provided as the input clock signal to the charge pump circuit by the clock signal output circuit.

8. The charging circuit of claim 1, wherein the integrating circuit comprises a resistor coupled between an output of the charge pump circuit and a first end of the boost capacitor, and wherein a second end of the boost capacitor is coupled to a ground.

9. The charging circuit of claim 8, further comprising a diode coupled in parallel with the resistor.

10. An amplifier comprising:
a charge pump circuit configured to generate a boosted voltage obtained by boosting an input voltage at each time interval shorter in accordance with an increase of a frequency of an input clock signal;
an integrating circuit configured to integrate a boosted voltage generated by the charge pump circuit to apply the integrated boosted voltage to one terminal of a first capacitor whose capacitance changes in accordance with an audio signal;
a differential amplifier having one input terminal connected with the other terminal of the first capacitor;
a second capacitor connected between an output terminal and the one input terminal of the differential amplifier so that a voltage at the output terminal changes in accordance with the audio signal;
a resistor disposed in parallel with the second capacitor and connected between the output terminal and the one input terminal;
a clamp circuit configured to clamp a voltage at the one input terminal between a first voltage level and a second voltage level, the first and second voltage levels being higher and lower, respectively, than a dc voltage level of the voltage at the one input terminal; and
a clock signal output circuit configured to output a second clock signal higher in frequency than a first clock signal to the charge pump circuit as the input clock signal for a predetermined period of time upon start up, and thereafter output the first clock signal to the charge pump circuit as the input clock signal, in order that a charge voltage of the first capacitor reaches a predetermined voltage level in a time shorter than a time in which the charge voltage of the first capacitor reaches the predetermined voltage level when the first clock signal is input to the charge pump circuit as the clock signal.

11. The amplifier of claim 10, wherein
the clamp circuit includes:
a first diode configured to be turned on to one input terminal is lowered, when a voltage at the one input terminal reaches the first voltage level; and
a second diode configured to be turned on to charge the second capacitor so that the voltage at the one input terminal is raised, when a voltage at the one input terminal reaches the second voltage level.

12. The amplifier of claim 10, wherein the clock signal output circuit includes:
a frequency divider circuit configured to divide the second clock signal in frequency to generate the first clock signal;
a counter configured to change a count value based on the first clock signal or the second clock signal; and
an output circuit configured to output the second clock signal as the clock signal to the charge pump circuit when a count value of the counter is smaller than a predetermined value, and output the first clock signal as the clock signal to the charge pump circuit when a count value of the counter reaches the predetermined value.

13. The amplifier of claim 10, further comprising a diode configured to rectify the boosted voltage to charge a boost capacitor coupled between the one terminal of the first capacitor and a ground.

14. The amplifier of claim 13, further comprising a diode configured to rectify the boosted voltage to charge the boost capacitor.

15. The charging circuit of claim 13, wherein the frequency divider circuit divides the second clock signal by 32.

16. The amplifier of claim 10, wherein the charge pump circuit comprises:
a first capacitor; and
a first switch connected between the input voltage and a first end of the capacitor, a second switch connected between the input voltage and a second end of the first capacitor, a third switch connected between the first end of the capacitor and a first end of a second capacitor, and a fourth switch connected between the second end of the first capacitor and a second send of the second capacitor;
wherein the first and fourth switches are switched on when the second and third switches are switched off, and the first and fourth switches are switched off when the second and third switches are switched on.

17. The amplifier of claim 10, wherein the boosted voltage is double the input voltage when the first clock signal is provided as the input clock signal to the charge pump circuit by the clock signal output circuit.

18. The amplifier of claim 10, wherein the integrating circuit comprises a resistor coupled between an output of the charge pump circuit and a first end of the boost capacitor, and wherein a second end of the boost capacitor is coupled to a ground.

19. The amplifier of claim 18, further comprising a diode coupled in parallel with the resistor.

20. A method, comprising:
providing a charge pump circuit in an amplifier circuit;
providing a first clock signal at a first frequency to the charge pump circuit for a predetermined period of time upon startup of the charge pump circuit;
providing a second clock signal at a second frequency that is lower than the first frequency to the charge pump circuit after the predetermined period of time; and
integrating an output of the charge pump circuit to apply a boosted voltage to a boost capacitor, wherein the boosted voltage is higher than an input voltage provided to the charge pump circuit.

* * * * *